United States Patent
Doi (10) Patent No.: US 7,411,420 B2
(45) Date of Patent: Aug. 12, 2008

(54) HIGH-SPEED INPUT SIGNAL RECEIVER CIRCUIT

(75) Inventor: Yoshiyasu Doi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 649 days.

(21) Appl. No.: 10/771,145

(22) Filed: Feb. 4, 2004

(65) Prior Publication Data
US 2006/0146958 A1    Jul. 6, 2006

(30) Foreign Application Priority Data
Feb. 28, 2003   (JP) .............................. 2003-052429

(51) Int. Cl.
H03K 19/0175 (2006.01)
H03K 19/094 (2006.01)
G01R 19/00 (2006.01)

(52) U.S. Cl. .............................. 326/82; 326/68; 327/51; 327/52; 365/189.21

(58) Field of Classification Search ................... 326/68, 326/82, 86, 87, 112, 115, 127, 121, 126, 326/85; 327/108, 109, 51–57; 365/189.21, 365/205
See application file for complete search history.

(56) References Cited

U.S. PATENT DOCUMENTS

| | | | | |
|---|---|---|---|---|
| 4,910,713 A | * | 3/1990 | Madden et al. | 365/189.11 |
| 4,973,864 A | * | 11/1990 | Nogami | 327/55 |
| 5,034,636 A | * | 7/1991 | Reis et al. | 327/52 |
| 5,502,680 A | * | 3/1996 | Du et al. | 365/205 |
| 5,650,971 A | * | 7/1997 | Longway et al. | 365/207 |
| 5,854,562 A | * | 12/1998 | Toyoshima et al. | 327/55 |
| 5,894,233 A | * | 4/1999 | Yoon | 327/55 |
| 6,046,609 A | * | 4/2000 | Toyoshima et al. | 327/55 |
| 6,204,697 B1 | * | 3/2001 | Zerbe | 326/98 |
| 6,218,892 B1 | * | 4/2001 | Soumyanath et al. | 327/537 |
| 6,278,308 B1 | * | 8/2001 | Partovi et al. | 327/218 |
| 6,310,501 B1 | * | 10/2001 | Yamashita | 327/215 |
| 6,396,309 B1 | * | 5/2002 | Zhao et al. | 327/55 |
| 6,426,656 B1 | * | 7/2002 | Dally et al. | 327/51 |
| 6,433,589 B1 | * | 8/2002 | Lee | 326/115 |
| 6,744,284 B2 | * | 6/2004 | Yoo et al. | 326/95 |
| 6,788,113 B2 | * | 9/2004 | Watanabe et al. | 327/66 |

(Continued)

FOREIGN PATENT DOCUMENTS

JP    54-103651    8/1979

(Continued)

*Primary Examiner*—Rexford Barnie
*Assistant Examiner*—Dylan White
(74) *Attorney, Agent, or Firm*—Arent Fox LLP (57) ABSTRACT

An input integrating circuit and a differential amplifier circuit are provided in a receiver circuit which samples a pair of differential input signals, detects the levels of said pair of input signals, and latches the detected levels. The above-mentioned input integrating circuit further includes: a pair of input transistors receiving the pair of input signals at respective gates thereof; a switch transistor becoming conducting in response to a sampling clock in a sampling period so as to supply a discharge current to a common source terminal of the pair of input transistors; and a precharge circuit precharging drain terminals of the pair of input transistors in a precharge period. The input integrating circuit discharges the capacitor of the drain terminals by the discharge current in the sampling period succeeding the precharge period. The differential amplifier circuit amplifies the drain terminals of the input integrating circuit.

14 Claims, 9 Drawing Sheets

U.S. PATENT DOCUMENTS

| | | | |
|---|---|---|---|
| 6,937,054 B2 * | 8/2005 | Hsu et al. | 326/30 |
| 7,098,699 B2 * | 8/2006 | Tamura et al. | 327/108 |
| 2003/0042965 A1 * | 3/2003 | Kanno et al. | 327/333 |
| 2003/0094985 A1 * | 5/2003 | Heo et al. | 327/202 |
| 2003/0132779 A1 * | 7/2003 | Yoo et al. | 326/81 |
| 2004/0090246 A1 * | 5/2004 | Gans | 327/57 |
| 2004/0239369 A1 * | 12/2004 | Hsu et al. | 326/115 |
| 2004/0257142 A1 * | 12/2004 | Kanno et al. | 327/333 |
| 2005/0122155 A1 * | 6/2005 | Tanaka et al. | 327/333 |
| 2005/0162193 A1 * | 7/2005 | Payne et al. | 327/52 |
| 2006/0017468 A1 * | 1/2006 | Azadet et al. | 326/115 |

FOREIGN PATENT DOCUMENTS

JP  2002-368592  12/2002

* cited by examiner

HIGH-SPEED INPUT SIGNAL RECEIVER CIRCUIT

CROSS-REFERENCE TO RELATED APPLICATIONS

This application is based upon and claims the benefit of priority from the prior Japanese Patent Application No. 2003-052429, filed on Feb. 28, 2003, the entire contents of which are incorporated herein by reference.

FIELD OF THE INVENTION

The present invention relates to a receiver circuit for receiving high-speed input signals having small amplitude, and more particularly to a receiver circuit by which input signals having higher speed and smaller amplitude can be received without error.

BACKGROUND OF THE INVENTION

There has been drastic improvement in LSI chips constituting computers and other information processing units, and output signal speed produced by each LSI chip is still getting faster. The LSI chips include, for example, SRAM, SDRAM, microprocessor, in which remarkable performance enhancement have been achieved. Such LSI chips are mounted on a printed circuit board, and high frequency signals are transmitted between these chips through signal transmission paths provided on the printed circuit board. Also, in an LSI such as an ASIC, high frequency signals are transmitted between high-speed circuit blocks.

The faster the signal transmission between circuit blocks or chips, or in an electronic device case is, the greater the signal attenuation in the transmission paths becomes. In such a signal that alternately repeats the H level and the L level, time margin for the reception signal to swing up to full amplitude becomes less, so that the amplitude of the reception signal is decreased. To cope with such a case, it is required to obtain a receiver circuit having high sensitivity, operating at high speed, and enabling accurate reception, even though high-frequency components in the reception signal is attenuated.

As a sample-and-hold circuit enabling extraction of reception signals stably at high speed, there has been proposed an analog comparator which converts a received analog signal to a digital signal by switching a current source of a bipolar transistor on and off by a sampling clock. (For example, [Official gazette of the Japanese Unexamined Patent Publication No. Sho-54-103651])

Also, there has been proposed a sample-and-hold circuit consisting of CMOS circuits, which alternately samples input signals through transfer gates, alternately amplifies in two differential amplifier circuits, and latches the amplified result. (For example, [Official gazette of the Japanese Unexamined Patent Publication No. 2002-368592])

Figure 1:
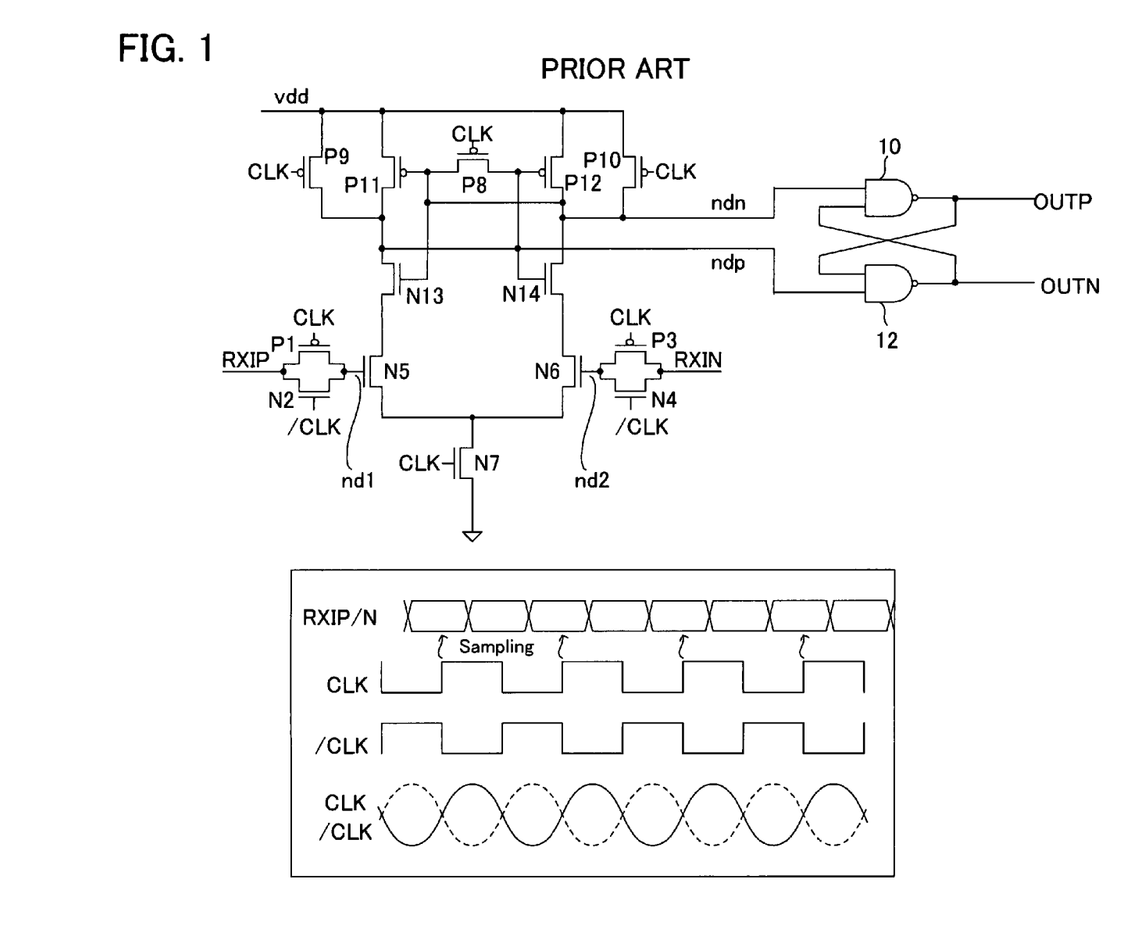
FIG. 1 shows a diagram illustrating an example of the conventional receiver circuit capable of dealing with high-speed reception signals.

Further, FIG. 1 shows a diagram illustrating an example of the conventional receiver circuit capable of dealing with high-speed reception signals. In order to receive high-frequency reception signals, reception data are demultiplexed in the vicinity of input data line of the receiver circuit to the possible extent, and in order to convert the reception signal to a low-frequency reception signal. The receiver circuit shown in FIG. 1 samples differential reception signals RXIP, RXIN by CMOS transfer gates P1, N2 and P3, N4, and a differential amplifier circuit amplifies the reception signals having been sampled at the nodes nd1, nd2. In the figure, a P-channel MOS transistor is denoted by a reference symbol P, while an N-channel MOS transistor is denoted by a reference symbol N. Also, a node is denoted by nd.

Referring to FIG. 1, the differential amplifier circuit includes: transistors N5, N6, of which sources are commonly connected; a switch transistor N7, which activates the amplifier circuit when a clock CLK lies in the H level; precharge transistors P9, P10, which precharge differential amplification output nodes ndn, ndp to a power supply voltage Vdd level while the clock CLK lies in the L level; and transistors P8, P11, P12, N13 and N14 constituting a regenerative latch circuit. The differential amplification output nodes ndn, ndp are supplied to an output latch circuit which consists of NAND gates 10, 12 having intersected connections between each output and input.

An operation waveform diagram of this receiver circuit is illustrated also in the figure. During the period of the clock CLK lying in the L level (or, the period of the reverse phase clock /CLK lying in the H level), the output nodes ndn, ndp of the differential amplifier are precharged to the power supply voltage Vdd level. During this period, the transfer gates P1, N2 and P3, N4 are controlled to be a conducting condition, and the differential input signals transmitted through transmission paths in the printed circuit board or the system circuit are sampled to parasitic capacitor of the input nodes nd1, nd2. When the clock CLK becomes H level, the transfer gates are controlled to be a non-conducting condition, and the differential amplifier circuit becomes to be separated from the input data line. Also, the transistors P9, P10 in the precharge circuit and the transistor P8 become non-conducting, and the switch transistor N7 becomes conducting. Thus the differential amplifier circuit detects the level of the input nodes nd1, nd2.

When the input node nd1 is in H level and the node nd2 is in L level, the current through the transistor N5 becomes greater than the current through the transistor N6, and the voltage level of the output node ndp drops faster than the voltage level of the output node ndn. In response to the voltage drop of the node ndp, the transistor N14 becomes non-conducting, and the transistor P12 becomes conducting. The voltage of the node ndn then rises again to the power supply voltage Vdd level, and thus the large voltage difference is produced between the output nodes ndp and ndn. Namely, by the regenerative latch circuit, the L level is generated in the output node ndp, and the H level is generated in the output node ndn. The H level and the L level produced above are respectively latched by the NAND gates 10, 12.

SUMMARY OF THE INVENTION

The conventional receiver circuit shown in FIG. 1 accepts the input signals while the clock CLK lies in the L level, and detects and latches the input signal levels while the clock CLK lies in the H level. Accordingly, if two pairs of the receiver circuits are provided and are driven by differential clocks, the input signal can be demultiplexed by two times, so that the levels of the input signal can be detected at one half of the input signal speed.

However, when operating at high frequency, in regard to the reception signal itself, a signal waveform becomes rounded, and the amplitude thereof becomes small. At the same time, waveforms of the control clocks CLK, /CLK become also rounded, and the amplitude becomes smaller than the full amplitude, as shown in the bottom of the waveform diagram. When the control clock becomes smaller in amplitude, the transfer gates accepting the input signals may not be in a complete non-conducting condition. Therefore, while the differential amplifier circuit is performing the amplification operation when the clock CLK is in the H level, an input signal in the next phase affects the input nodes nd1, nd2 via the transfer gates which lies in a semi-conducting condition, so that an operational error may be produced.

Further, in order to decide the level after amplifying the high-speed input signals RXIP, RXIN having smaller amplitude, it is necessary to set the gains of the transistors N5, N6 high. When the gains are set higher, noise is amplified larger, so that a signal-to-noise ratio becomes deteriorated. Also, setting the gains higher produces increased dispersion of the gains caused by the dispersed transistor characteristic. (The characteristic dispersion×G=dG, where G denotes gain, and dG denotes dispersion in the gain.) Therefore, the level decision becomes unstable.

According to one aspect of the present invention, an input integrating circuit and a differential amplifier circuit are provided in a receiver circuit which samples a pair of differential input signals, detects the levels of said pair of input signals, and latches the detected levels. The above-mentioned input integrating circuit further includes: a pair of input transistors receiving the pair of input signals at respective gates thereof; a switch transistor becoming conducting in response to a sampling clock in a sampling period so as to supply a discharge current to a common source terminal of the pair of input transistors; and a precharge circuit precharging drain terminals of the pair of input transistors in a precharge period. The input integrating circuit discharges the capacitor of the drain terminals by the discharge current in the sampling period succeeding the precharge period. The differential amplifier circuit amplifies the drain terminals of the input integrating circuit.

According to the above-mentioned aspect of the present invention, the input integrating circuit is provided in an input stage, and thereby the pair of input signals is integrated and sampled in the sampling period. On completion of the sampling period, the discharge current is cut off by a sampling clock, making the pair of input transistors non-conducting condition, so that the differential amplifier circuit for level detection is separated from the input signals. This enables stable level detection without being influenced by the input signal of the next phase. The switch transistor is controlled to be conducting or non-conducting by the sampling clock, and therefore the semi-conducting condition caused by a high-speed clock, which may occur in the conventional transfer gate, is not produced. In addition, even when the input signals have small amplitude, the level difference can be sampled stably by the integrating circuit operation which discharges the capacitor.

In the above-mentioned aspect of the present invention, as a preferred embodiment, the input integrating circuit includes a pair of positive feedback transistors, provided in parallel with the precharge circuit, which charges one drain terminal out of the pair of drain terminals, corresponding to the level of the other drain terminal.

According to this preferred embodiment, when the discharge current supplied to the drain terminals increases because of a dispersion of the transistor characteristic, the positive feedback transistor operates according to the increase of the discharge current. As a result, a drop of the drain terminal level is suppressed, thus the drain terminal level being maintained within an operation range of the differential amplifier circuit provided in the latter stage. Therefore, error operation in the level detection can be prevented.

As another preferred embodiment of the present invention, in the input integrating circuit, capacitors for dispersion adjustment are respectively connected to the pair of drain terminals via transistors. According to this embodiment, when the discharge current supplied to the drain terminals becomes increased because of a dispersion of the transistor characteristic, the capacitance of the capacitors for dispersion adjustment becomes large at high frequency. Accordingly, error operation in the level detection caused by the increase of the discharge current can be prevented.

As still another preferred embodiment of the present invention, the pair of input transistors is constituted of first conductivity type transistors. Further, the input integrating circuit includes: a pair of positive-feedback transistors having a second conductivity type, provided in parallel with the precharge circuit, which charge one drain terminal out of the pair of drain terminals according to the level of the other drain terminal; and capacitors for dispersion adjustment respectively connected to the pair of drain terminals via CMOS transfer gates.

In this embodiment, when the discharge current supplied to the drain terminals increases because of a dispersion of the transistor characteristic, the positive feedback transistor operates according to an increase of the discharge current, maintaining the drain terminal level within the operation range of the differential amplifier circuit provided in the latter stage. Moreover, corresponding to the dispersion of the transistor characteristic of both the first conductivity type transistor and the second conductivity type transistor, the capacitance of the aforementioned capacitors for dispersion adjustment vary at high frequency, and the drain terminal level is maintained within the operation range of the differential amplifier circuit provided in the latter stage. Thus, error operation in the level detection can be prevented.

Further scopes and features of the present invention will become more apparent by the following description of the embodiments with the accompanied drawings.

DETAILED DESCRIPTION OF THE PREFERRED EMBODIMENTS

The preferred embodiments of the present invention are described hereinafter referring to the charts and drawings. However, it is noted that the scope of the present invention is not limited to the embodiments described below, but instead embraces all the inventions described by the claims and equivalents thereof.

It is an object of the present embodiment to provide a receiver circuit capable of stable reception of high-frequency input signals having small amplitude.

It is also an object of the present embodiment to provide a receiver circuit capable of stable operation against a dispersed transistor characteristic.

Figure 2:
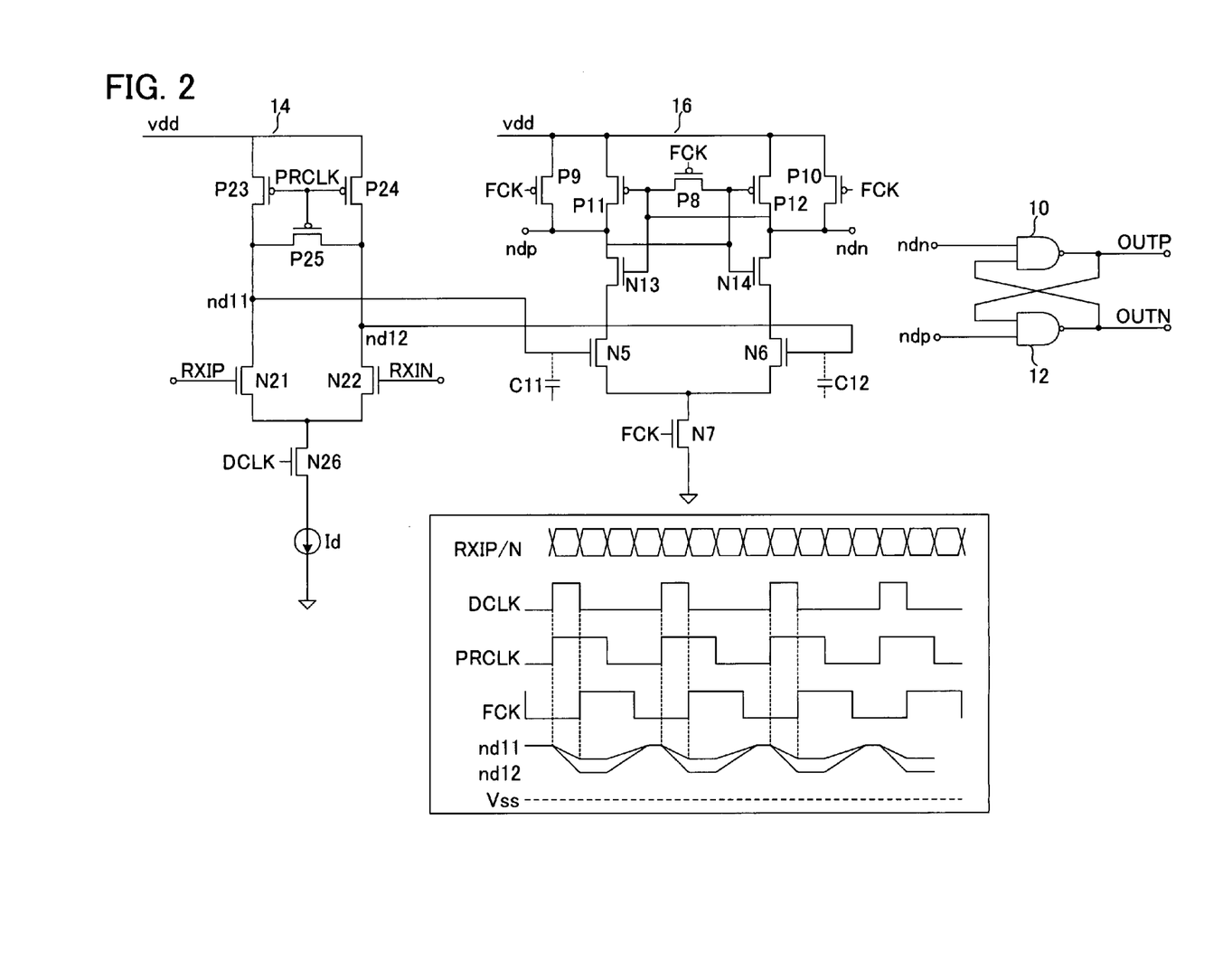
FIG. 2 shows a diagram illustrating a high-speed data receiver circuit according to the embodiment of the present invention.

FIG. 2 shows a diagram illustrating a high-speed data receiver circuit according to the embodiment of the present invention. In FIG. 2, a circuit diagram of the receiver circuit is shown together with an operation waveform thereof. The receiver circuit according to the embodiment is provided with an input integrating circuit 14 in an input stage receiving input signals. An output node pair nd11, nd12 of the input integrating circuit 14 is connected to a differential amplifier circuit 16 provided in the latter stage in which differential amplification is performed. An amplified output node pair ndp, ndn is latched by a latch circuit constituted of NAND gates 10, 12.

Input integrating circuit 14 is provided with a pair of input transistors N21, N22 each of which receives a high-speed differential input pair RXIP, RXIN, exemplarily on the order of 10 Gigabits per second, at the gates of the transistors N21, N22, respectively. Input integrating circuit 14 is also provided with a switch transistor N26 which becomes conducting in response to a sampling clock DCLK during a sampling period, and supplies a discharge current Id to a common source terminal of the input transistors N21, N22. Further, input integrating circuit 14 is provided with a precharge circuit, which is constituted of transistors P23-P25 and precharges drain terminals nd11, nd12 of the input transistors N21, N22 during a precharge period.

The sampling clock DCLK becomes H level once for four phases of the input signal pair RXIP, RXIN, as illustrated in the figure, by which the input signal in the phase of interest is taken in or sampled. While the sampling clock DCLK lies in L level, the precharge clock PRCLK becomes the L level, and thereby the transistors P23-P25 in the precharge circuit become conducting. Thus, the drain terminals nd11, nd12 of the input transistors are precharged into a power supply voltage Vdd level. In a sampling period after the precharge period, the precharge clock PRCLK becomes the H level, the precharge circuit becomes cut off, the sampling clock DCLK becomes the H level, and the switch transistor N26 becomes conducting. In response to this, parasitic capacitors C11, C12 connected to the above-mentioned drain terminals nd11, nd12 are discharged by the discharge current Id.

This discharge current Id is allocated to the drain terminals nd11, nd12, depending on either conducting or non-conducting conditions of the input transistors N21, N22. Namely, the input transistor on the input signal side having a higher level among the input signal pair RXIP, RXIN produces a larger discharge current flow. With this allocated discharge current, each parasitic capacitor C11, C12 is discharged, and the levels of the drain terminals nd11, nd12 are dropped with a drop value as much as the integrating value of the discharge current. This discharge operation is performed only in the duration the sampling clock DCLK is in the H level. At the time of the sampling clock DCLK becoming the L level, a certain amount of voltage difference has been produced between the drain terminal pair nd11, nd12.

When the sampling clock DCLK becomes the L level, the switch transistor N26 becomes non-conducting, and the drain terminal pair nd11, nd12 in which the voltage difference has been produced is separated from the input signals RXIP, RXIN. Thereafter, the drain terminal pair nd11, nd12 is not affected by the change of the input signals which may occurs at the following phase.

On completion of the above-mentioned integrating operation as the sampling period is completed, a differential operation clock FCK becomes the H level, which enables the differential amplifier circuit 16 to be activated. In the differential amplifier circuit 16, as described before referring to FIG. 1, the transistors P9, P10 have been conducting just before the activation, caused by the L level of the differential operation clock FCK, so that the differential amplification output pair ndp, ndn are precharged to the power supply voltage Vdd level. When the differential operation clock FCK is turned to the H level, the transistors P9, P10 become non-conducting, and the transistor N7 becomes conducting. Then, the transistor pair N5, N6 produce a current flow corresponding to each level of the drain terminal pair nd11, nd12, and the level of either one of the differential output pair ndp, ndn is fallen more intensively than the other.

Now, assuming the level of the input signal RXIP is higher than the level of the input signal RXIN at the sampling period, the drain terminal nd11 becomes a lower level than the drain terminal nd12. Thus, the transistor N6 becomes more conducting than the transistor N5 and therefore produces more current. This results in the differential output terminal ndn becoming a lower level than the differential output terminal ndp. As the level of the differential output terminal ndn drops, the transistor N13 constituting the regenerative latch circuit becomes non-conducting, whereas the transistor P11 becomes conducting. Thus, the level of the opposite differential output terminal ndp is raised, and accordingly a larger level difference is produced between the differential output terminal pair ndp, ndn. In such a way, the input signal levels are determined in the differential amplifier circuit 16. These levels of the differential output terminal pair ndp, ndn are latched in the latch circuit 10, 12 provided in the latter stage.

While the differential amplification operation is being performed in the the differential amplifier circuit 16, the precharge clock PRCLK in the input integrating circuit 14 is set to the L level, and the voltages of the drain terminal pair nd11, nd12 are raised to the power supply voltage Vdd. However, at this time, the regenerative latch circuit in the differential amplifier circuit 16 has already latched the detected level difference, and therefore this precharge operation affects no impediment on the differential amplification operation.

In the receiver circuit shown in FIG. 2, the sampling operation is performed once for four cycles of input signals. Therefore, it is necessary to provide four sets of the receiver circuits shown in FIG. 2 in parallel, so as to demultiplex the same input signal pair RXIP, RXIN successively. This enables the receiver circuit operating at a period four times longer than the period of high-frequency input signals. Thus, stable input signal detection can be achieved.

In the receiver circuit shown in FIG. 2, by providing input integrating circuit 14, the input signals are taken in or sampled during the sampling period, and the differential amplifier circuit 16 provided in the latter stage performs the level detection in a condition separated from the input signals. Accordingly, it becomes possible to suppress an influence of the input signals against the detection operation in the differential amplifier circuit 16.

Figure 3:
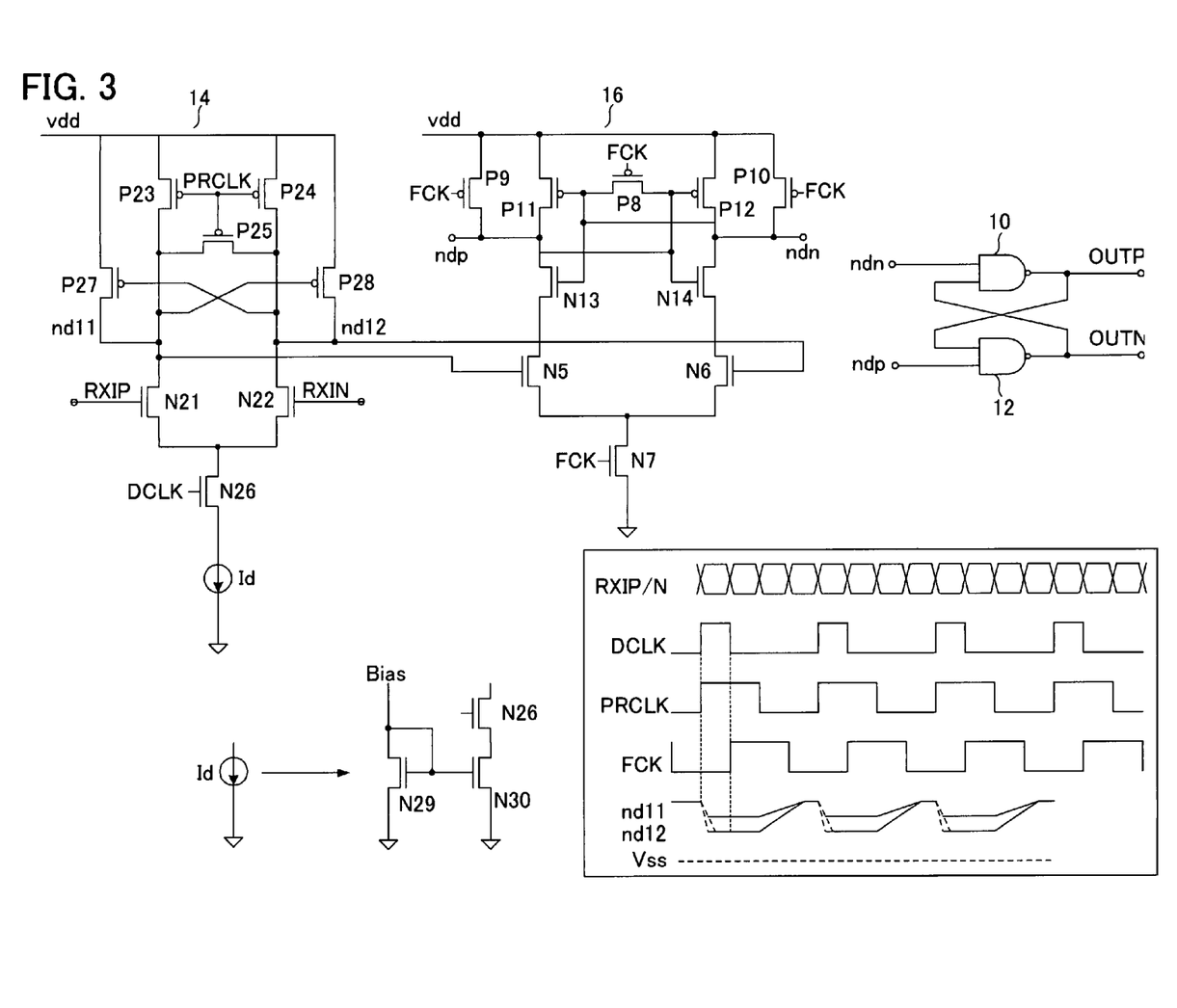
FIG. 3 shows a diagram illustrating an exemplary variation of the receiver circuit according to the embodiment of the present invention.

FIG. 3 shows a diagram illustrating an example of variation of the receiver circuit according to the embodiment of the present invention. Identical reference symbols are given to the identical circuit elements shown in FIG. 2. This variation example prevents the input integrating circuit from becoming unable to sample the levels of the input signal pairs RXIP, RXIN properly, caused by the dispersed transistor characteristic.

The current source Id of the discharge current is achieved by a current mirror circuit constituted of transistors N29, N30, as shown in the figure. Now, it is assumed that the characteristic of the current mirror current becomes large caused by, for example, a reduced threshold voltage of the N-channel transistor resulting from a dispersion of manufacturing process. Under such an assumption, in the integration operation of input integrating circuit 14, the discharge current Id flowing through the transistors N26, N21, N22 becomes large, and each level of the drain terminal pair nd11, nd12 becomes decreased from the precharge level during the sampling period, so that the level difference between the drain terminal pair nd11, nd12 is not produced at the time the sampling period is completed. Such a case is shown in the waveform diagram of FIG. 3, by the broken line of the drain terminal pair nd11, nd12.

Namely, depending on the level difference between the input signal pair RXIP, RXIN, first the level difference is produced between the drain terminal pair nd11, nd12. After one of the drain terminal potential is completed to drop, the potential of the other drain terminal also drops, and the levels of these two drain terminal becomes identical at the time the sampling period is completed. This influences impediment against the level detection thereafter, performed by the differential amplifier circuit 16.

To cope with the above problem, in the input integrating circuit 14 of the receiver circuit shown in FIG. 3, there is provided a pair of positive feedback transistors P27, P28 in parallel with the transistors P23, P24 of the precharge circuit, by which one drain terminal of the drain terminal pair nd11, nd12 is charged corresponding to the level of the other drain terminal. With these positive feedback transistors P27, P28, when the level drop in one of the drain terminals nd11, nd12 becomes large because of the dispersed transistor characteristic, the positive feedback transistor provided on one drain terminal side becomes conducting in response to a preceded level drop of the other drain terminal, and the level of the one drain terminal is raised to the power supply level Vdd. With this, it becomes possible to prevent the drain terminal pair nd11, nd12 from becoming an identical level on the completion of the sampling period, as described earlier.

For example, when the input signal RXIP is higher than the input signal RXIN, the level of the drain terminal nd11 drops in advance of the level drop of the drain terminal nd12, resulting from the difference of the discharge currents. Accordingly, in response to the level drop in the drain terminal nd11, the positive feedback transistor P28 becomes conducting, so that the level drop in the other drain terminal nd12 is suppressed. When the discharge current becomes excessive because of the dispersed transistor characteristic, producing the level drop in both the drain terminal pair nd11, nd12, one of the positive feedback transistor pair P27, P28 becomes conducting, and raises the level of the drain terminal on that side. Accordingly, it becomes possible to produce a differential voltage between the drain terminal pair nd11, nd12, corresponding to the input signal pair RXIP, RXIN.

As such, in input integrating circuit 14 of the receiver circuit shown in FIG. 3, even when the discharge current of the integration operation becomes large because of the dispersed transistor characteristic, the positive feedback transistors raise the level of the drain terminal side which is not to be discharged. When the discharge current caused by the dispersed transistor characteristic is not large, input integrating circuit 14 operates in the same way as shown in FIG. 2.

In the variation example shown in FIG. 3, the differential amplifier circuit 16 and latch circuits 10, 12 provided in the latter stage have the same configurations as the circuits shown in FIG. 2.

Figure 4:
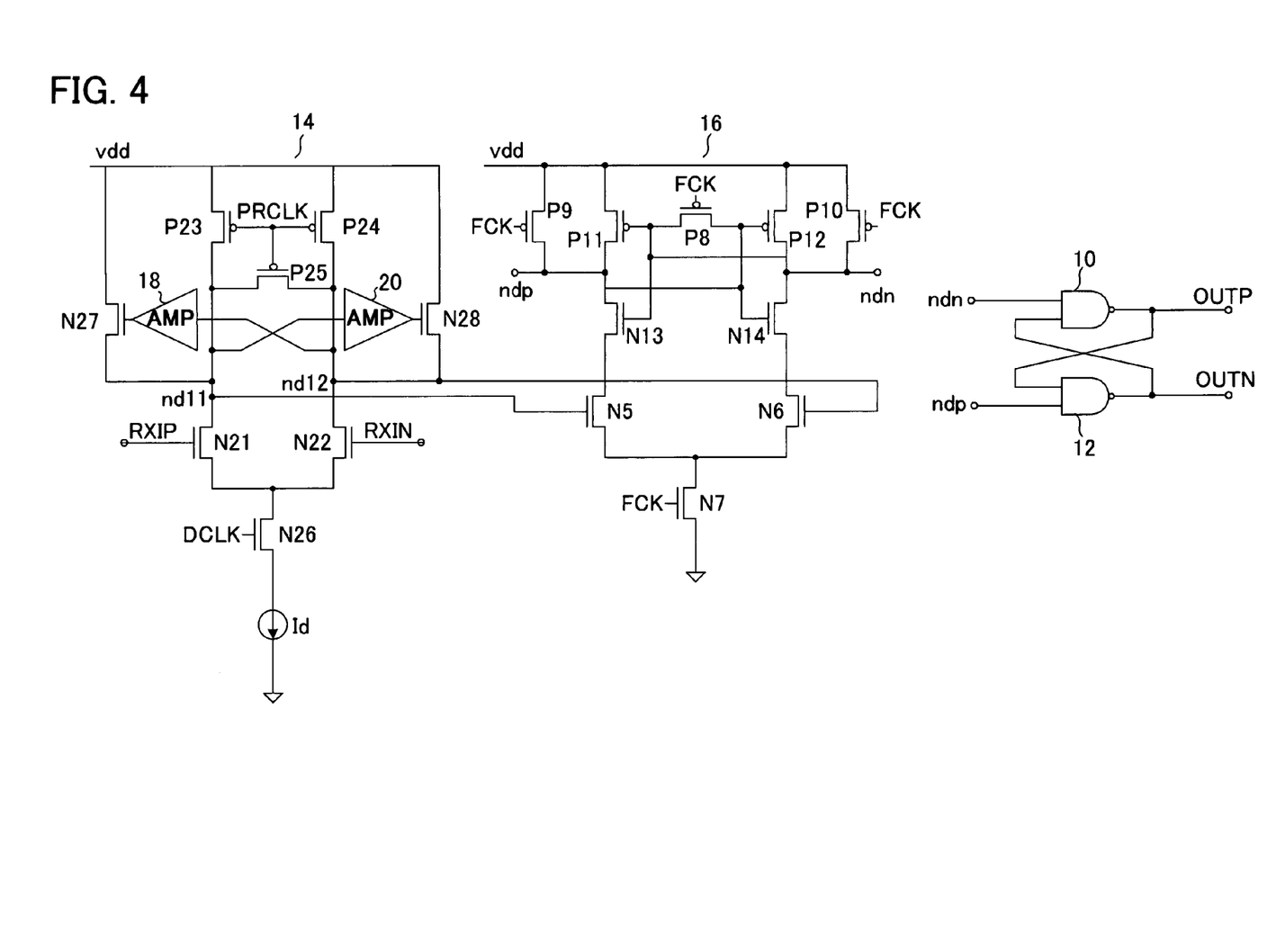
FIG. 4 shows a diagram illustrating an exemplary variation of the receiver circuit according to the embodiment of the present invention.

FIG. 4 shows a variation example of the receiver circuit according to the embodiment of the present invention. In FIG. 4 also, positive feedback transistors N27, N28 are provided in input integrating circuit 14. In the example shown in FIG. 3, the positive feedback transistors P27, P28 are constituted of P-channel transistors. In contrast, in the example shown in FIG. 4, N-channel positive feedback transistors N27, N28 are provided. Together with these transistors, there are provided an amplifier circuit 20 which inputs the drain terminal nd11 and drives the positive feedback transistor N28, and an amplifier circuit 18 which inputs the drain terminal nd12 and drives the positive feedback transistor N27. Both amplifier circuits 18, 20 make the positive feedback transistor N27 or N28 to be conducting when the corresponding input level drops.

Figure 5:
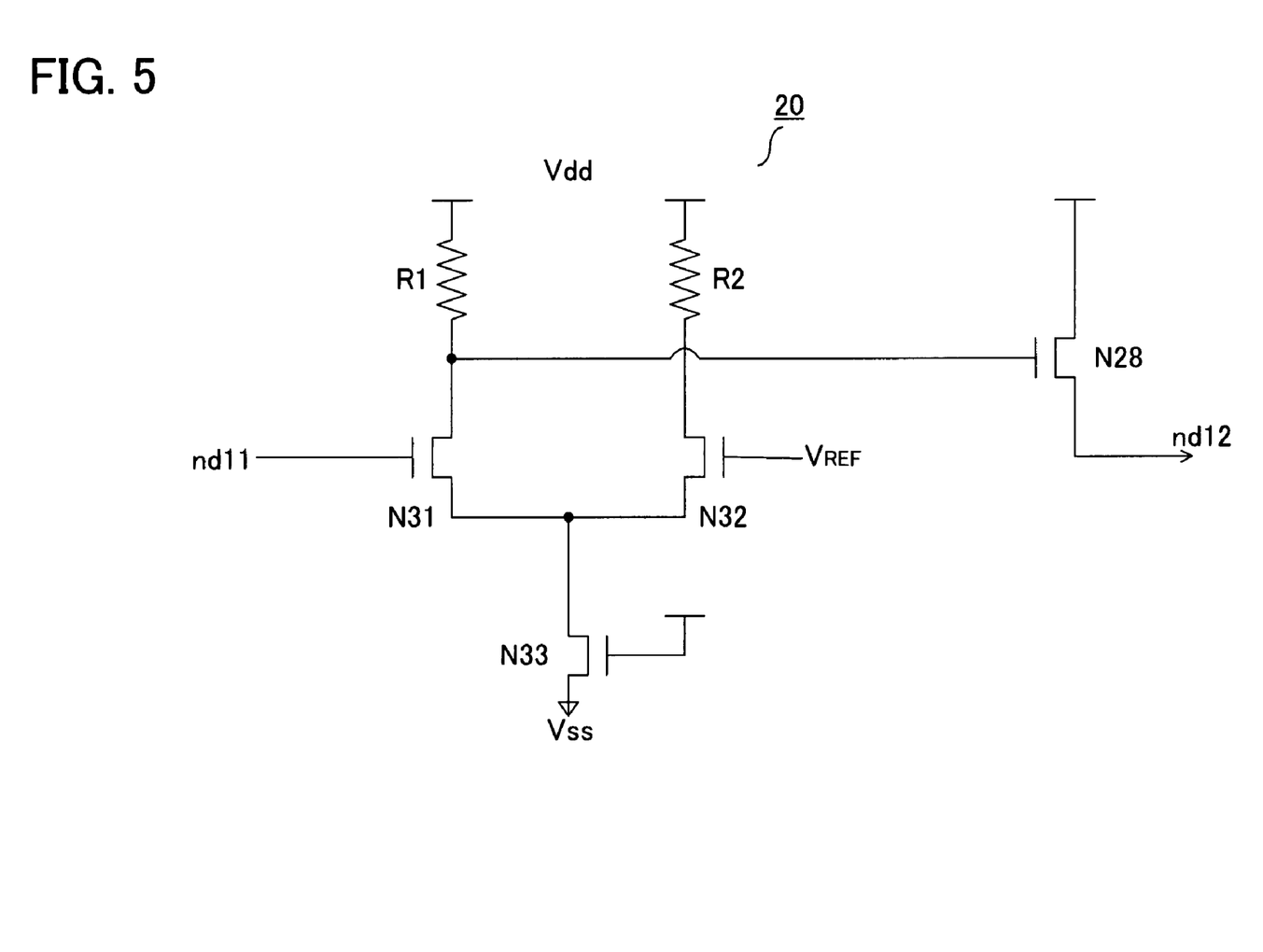
FIG. 5 shows a diagram illustrating an exemplary amplifier circuit driving a positive feedback transistor.

FIG. 5 shows a diagram illustrating an exemplary amplifier circuit driving a positive feedback transistor. In this amplifier circuit 20, a switch transistor N33 is connected to a common source terminal of a transistor N31, into which the drain terminal nd11 is input, and a transistor N32 to which a reference voltage VREF is input. The drain terminals of the transistors N31, N32 are connected to the power supply voltage Vdd through load resistors R1, R2, respectively. The drain terminal of the transistor N31 is also connected to the gate of the positive feedback transistor N28. Amplifier circuit 18 has also a similar configuration.

In amplifier circuit 20 shown in FIG. 5, when the level of the drain terminal nd11 of input integrating circuit 14 drops, the transistor N32 becomes more conducting than the transistor N31. Thus, the drain terminal level of the transistor N31 rises, and the positive feedback transistor N28 becomes conducting. This prevents the level of the other drain terminal nd12 from dropping.

In the variation examples shown in FIGS. 3, 4, even when the discharge current of the input integrating circuit increases because of the dispersed transistor characteristic, a voltage difference corresponding to the level difference of the input signal pair RXIP, RXIN is properly produced between the output terminal pair nd11, nd12, enabling detection operation by the differential amplifier circuit 16 in the latter stage.

Figure 6:
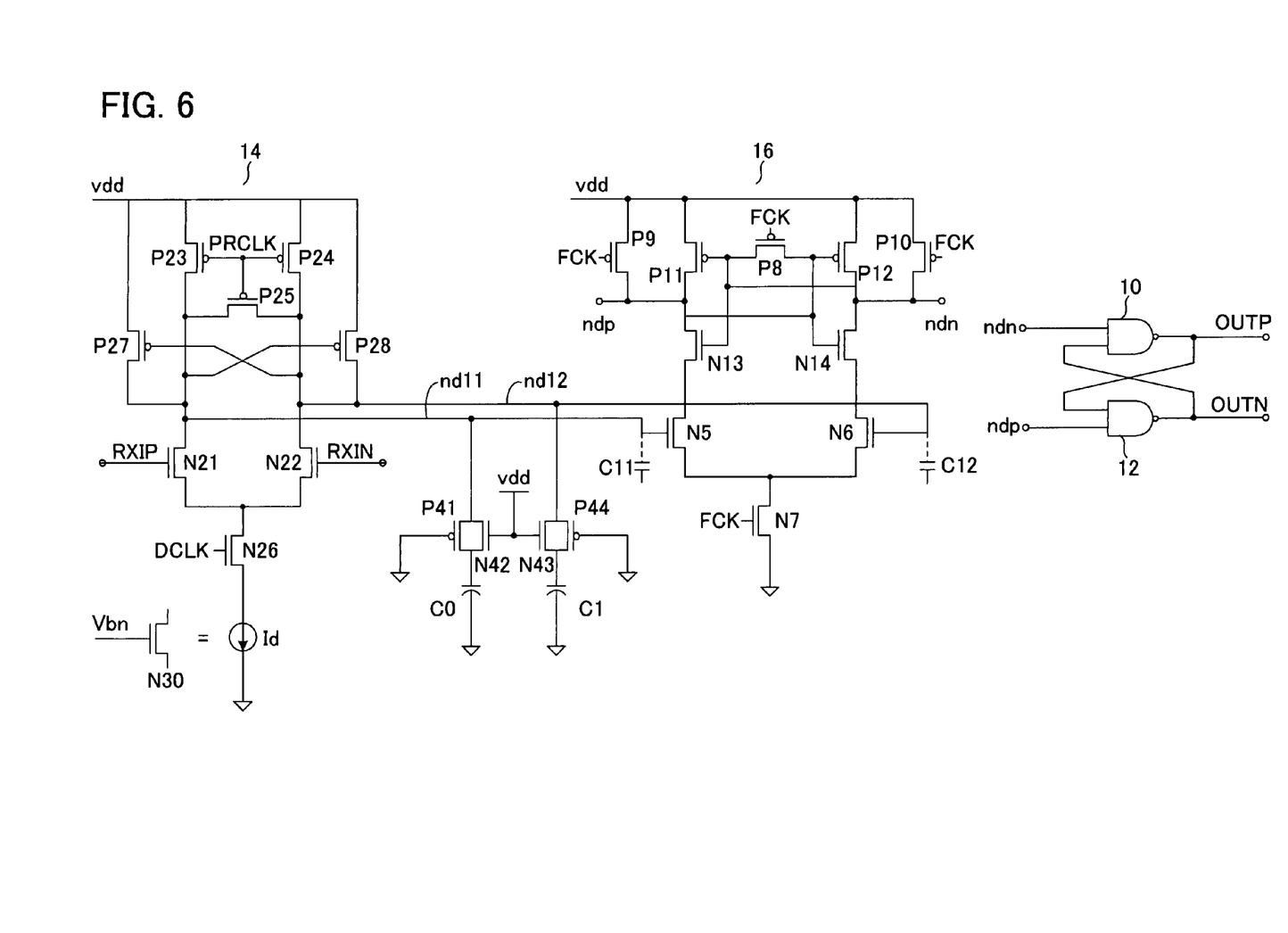
FIG. 6 shows another exemplary variation of the receiver circuit according to the embodiment of the present invention.

FIG. 6 shows another variation example of the receiver circuit according to the embodiment of the present invention. This variation example prevents sampling operation of input integrating circuit 14 from being impeded caused by the dispersed transistor characteristic. When the conducting resistance of the N-channel transistor is reduced (i.e. the degree of conduction is higher) because of the dispersed characteristic, the discharge current Id becomes excessively large, which may eliminate the level difference between the drain terminal pair nd11, nd12, as described earlier. In such a case, the above-mentioned problem can be solved to some extent by the provision of the positive feedback transistors P27, P28. Here, in order to operate the positive feedback transistor pair P27, P28 correctly, it is necessary that a certain level difference be produced between the drain terminal pair nd11, nd12.

For this purpose, according to the variation example shown in FIG. 6, capacitors C0, C1 for dispersion adjustment are connected to the drain terminal pair nd11, nd12 of the input transistor pair N21, N22 in the input integrating circuit 14, via CMOS transfer gates P41, N42 and P44, N43. For example, when the conducting resistance of the N-channel transistor is reduced (i.e. the degree of conduction is higher) because of the dispersed characteristic, the conducting resistance of the N-channel transistors N42, N43 in the CMOS transfer gates is also reduced. As a result, the drain terminal pair nd11, nd12 is connected to capacitors C0, C1 through low resistance N42, N43. Accordingly, at the time of the integrating operation, the capacitance connected to the output terminals nd11, nd12 of input integrating circuit 14 becomes larger at high frequency. In other words, because the ON-resistance of the N-channel transistors N42, N43 of the CMOS transfer gates is low, it becomes an identical condition to that a circuit having a small CR time constant is connected to the drain terminal pair nd11, nd12. As a result, at high frequency, more discharge current flows from the discharge adjustment capacitors C0, C1.

Thus, at the time of integrating operation, it comes to an equivalent condition to that larger capacitances C0, C1 are connected to the drain terminal pair nd11, nd12. Accordingly, it becomes possible to refrain both levels of the drain terminal pair nd11, nd12 from dropping during the integration operation.

Oppositely, when the conducting resistance of the N-channel transistor is increased because of the dispersed characteristic, the conducting resistance of the N-channel transistors N42, N43 of the CMOS transfer gates also becomes increased. This is equivalent to that smaller capacitors C0, C1 are connected to the drain terminal pair nd11, nd12 at high frequency. Therefore, even when the discharge current Id becomes small because of the increased conducting resistance of the N-channel transistor, a sufficient level difference can be produced between the drain terminal pair nd11, nd12 by the integrating operation.

Moreover, when the conducting resistance of the P-channel transistor is increased (i.e. the degree of conduction is low) because of the dispersed characteristic, charging capability of the positive feedback transistors P27, P28 is reduced. However, in such a case, the conducting resistance of the P-channel transistors P41, P44 of the CMOS transfer gate rises, and the dispersion adjustment capacitors C0, C1 connected to the drain terminal pair nd11, nd12 becomes smaller in capacitance at high frequency. Accordingly, even when the charging capability of the positive feedback transistors P27, P28 is reduced, it becomes possible to raise either one of the levels of the drain terminal pair nd11, nd12.

Oppositely, when the conducting resistance of the P-channel transistor is reduced (i.e. the degree of conduction is high) because of the dispersed characteristic, the charging capability of the positive feedback transistors P27, P28 is increased. However, in this case, the conducting resistance of the P-channel transistors P41, P44 in the CMOS transfer gates also reduces, and the dispersion adjustment capacitors C0, C1 connected to the drain terminal pair nd11, nd12 becomes larger in capacitance at high frequency. Accordingly, even when the charging capability of the positive feedback transistors P27, P28 is increased, the levels of the drain terminal pair nd11, nd12 are not raised excessively, and thus a proper level difference is produced therebetween.

As having been described, even the dispersed characteristic occurs, it is possible to adjust the undesired influence caused by the characteristic dispersion by the use of the CMOS transfer gates and the dispersion adjustment capacitors C0, C1.

In the example shown in FIG. 6, in case the positive feedback transistors P27, P28 are not provided, it is desirable to configure the transfer gates for dispersion adjustment by use of the N-channel transistors only. Also, in case the positive feedback transistors are constituted of N-channel transistors, it is desirable to configure the transfer gates by use of the N-channel transistors only.

Figure 7:
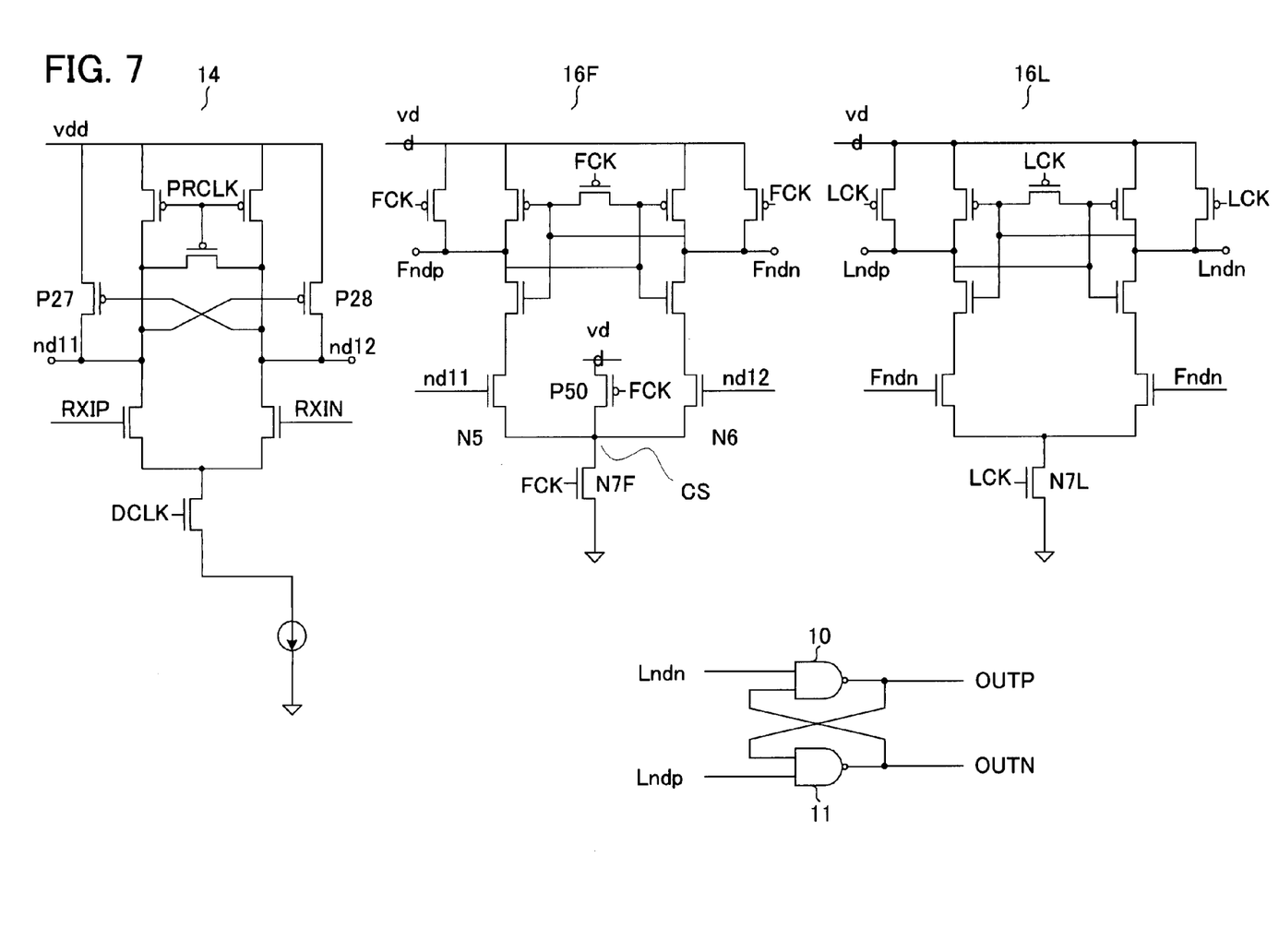
FIG. 7 shows still another exemplary variation of the receiver circuit according to the embodiment of the present invention.
Figure 8:
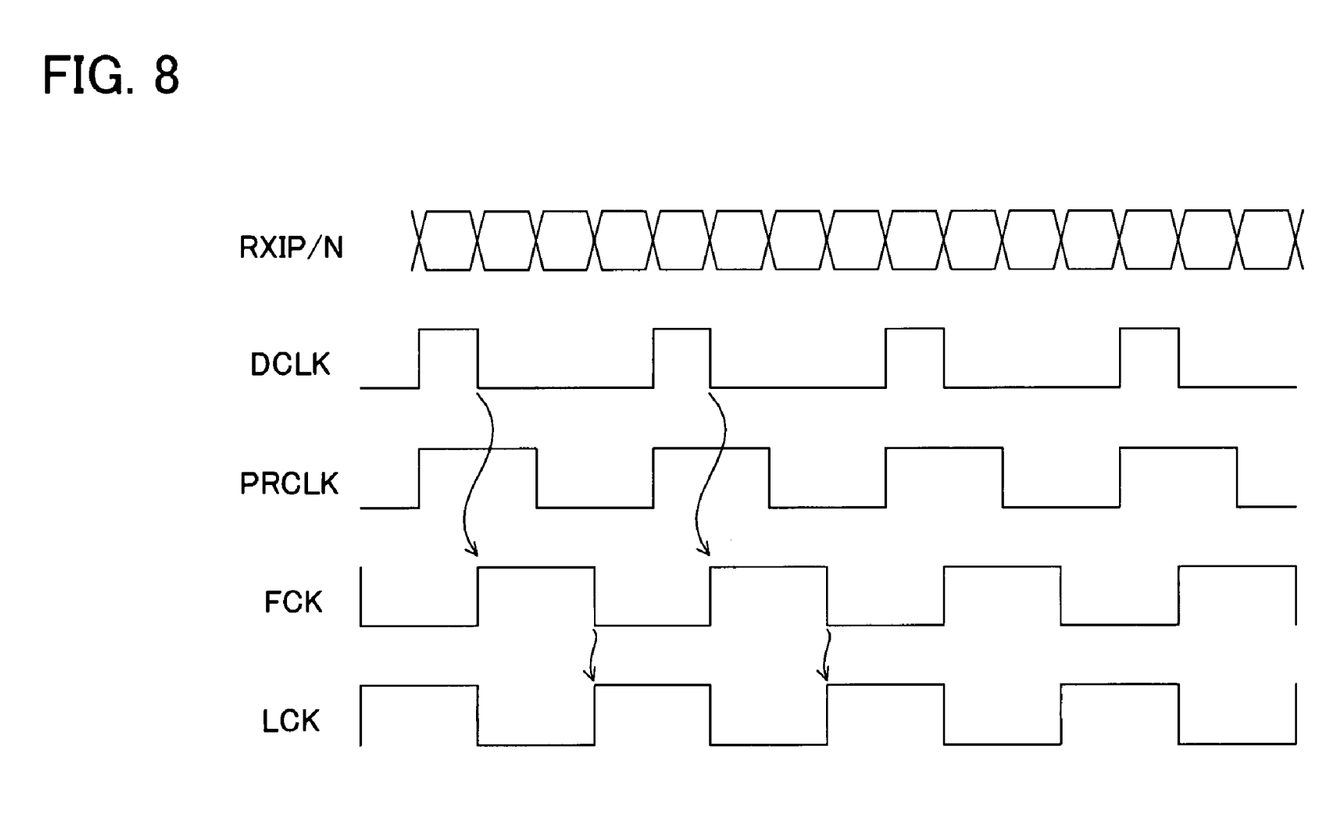
FIG. 8 shows an operation waveform diagram of the receiver circuit shown in FIG. 7.
Figure 9:
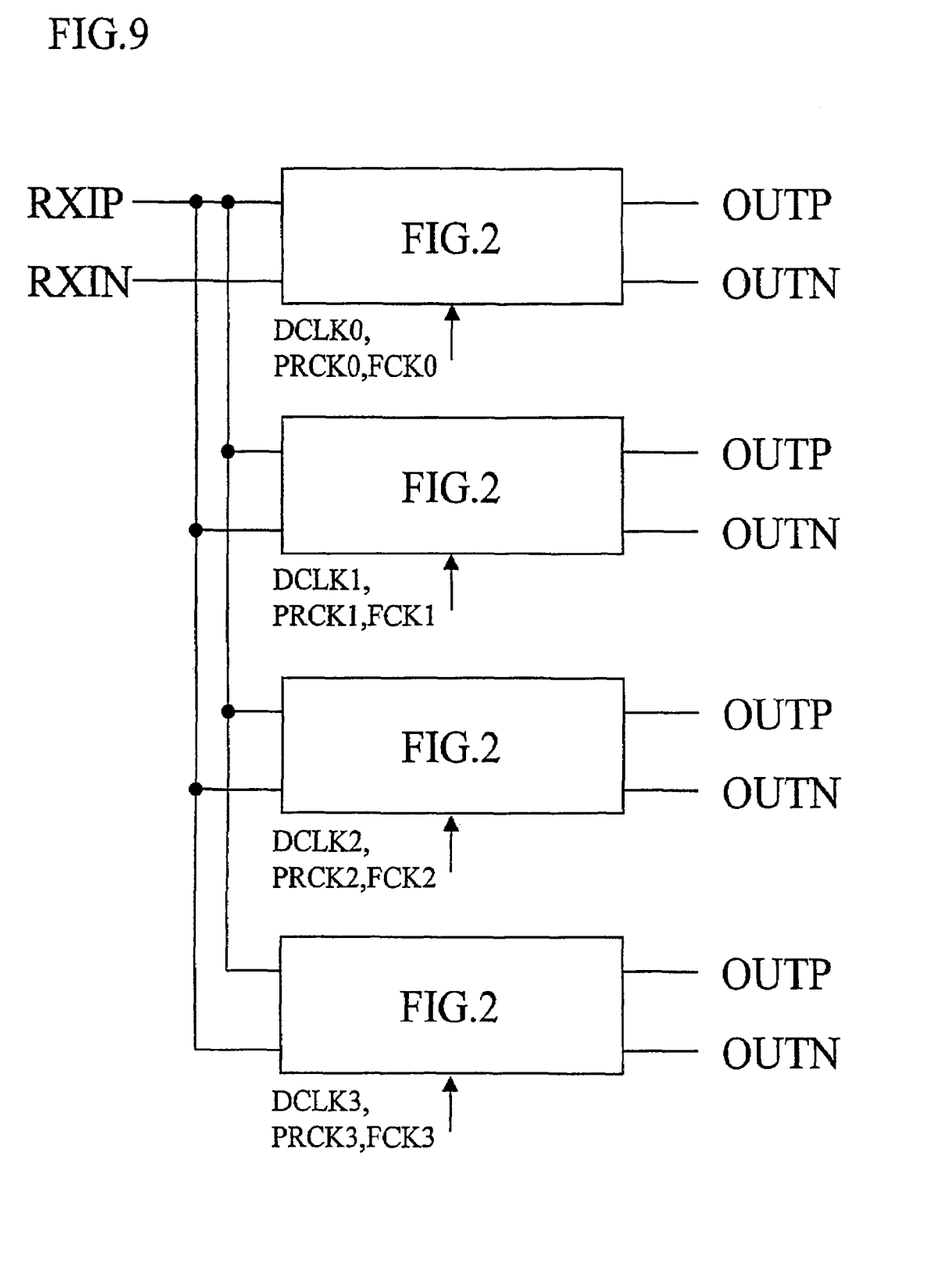
FIG. 9 shows a diagram illustrating an example of a receiver circuit having a plurality of pairs of receiver circuits.

FIG. 7 shows still another variation example of the receiver circuit according to the embodiment of the present invention. FIG. 8 shows an operation waveform diagram. In this variation example, the input integrating circuit 14 has the same configuration as the configuration having the positive feedback transistors P27, P28 shown in FIG. 3. The difference lies in the differential amplifier circuit, which detects the level difference between the output pair nd11, nd12 of the input integrating circuit 14, being constituted of a front stage circuit 16F and a latter stage circuit 16L. Further, an activation clock FCK activating the front stage circuit 16F has a reverse-phase relation against an activation clock LCK activating the latter stage circuit 16L, as shown in FIG. 8. The front stage circuit 16F and the latter stage circuit 16L are activated alternately.

Referring to the operation waveform diagram shown in FIG. 8, operation of this circuit is described below. When the sampling clock DCLK becomes the H level, input integrating circuit 14 is activated, and the level difference is produced between the drain terminal pair nd11, nd12 through the integrating operation by the discharge current corresponding to the level difference of the input signal pair RXIP, RXIN. Next, when the sampling clock DCLK becomes the L level, the activation clock FCK becomes the H level, and thus the front-stage differential amplifier circuit 16F is activated. The level difference between the drain terminal pair nd11, nd12 is detected when the clock FCK becomes the H level, and the predetermined level difference is produced in the output terminal pair Fndp, Fndn of the front stage circuit 16F. Thereafter, when the activation clock FCK activating the front stage circuit 16F becomes the L level, the activation clock LCK activating the latter stage circuit 16L becomes the H level, in place of the activation clock FCK, by which the level difference between the front-stage output terminal pair Fndp, Fndn is amplified in the latter-stage amplifier 16L, and then latched in the regenerative latch circuit. Although the front-stage amplifier circuit 16F is precharged at this time, no impediment is produced on the amplification operation in the latter-stage amplifier circuit 16L, because a high-speed amplification operation and a regenerative latch circuit operation are performed in the latter-stage amplifier circuit 16L.

Also, a P-channel transistor P50 is provided for precharging the common source terminal CS of the input transistor pair N5, N6 in the front stage circuit 16F. With this transistor, the level of the common source terminal CS is also raised to the power supply voltage Vdd level at the time of the precharge. Accordingly, it becomes possible to amplify at high speed the output level difference nd11, nd12 of the input integrating circuit 14 having a small level difference.

In this variation example, because the differential amplifier circuit has a multi-stage configuration 16F, 16L, the gains of the respective differential amplifier circuits 16F, 16L can be set relatively small, which prevents an input signal noise from being amplified. Furthermore, by reducing the input transistor gain (N5, N6), it becomes possible to reduce the dispersion in the gain caused by the dispersed characteristic, and obtain a stable detection operation of the differential amplifier circuit.

Moreover, in this variation example, the differential amplifier circuit provided in each stage has the precharge circuit, by which the output terminal pair is reset and restored to the initial condition. Therefore, it is possible to prevent occurrence of error operation depending on a data pattern of the preceding phase.

To summarize, according to the present invention, a high-speed receiver circuit enabling stable reception level detection less influenced by input signals can be provided.

What is claimed is:

1. A receiver circuit which samples a pair of differential input signals, detects a level of said pair of input signals, and latches the detected level said receiver circuit comprising:
an input integrating circuit including:
a pair of input transistors receiving the pair of input signals at respective gates thereof,
a switch transistor becoming conducting in response to a sampling clock in a sampling period so as to supply a discharge current to a common source terminal of said pair of input transistors, and
a precharge circuit precharging drain terminals of said pair of input transistors in a precharge period,
wherein said input integrating circuit discharges capacitors of the drain terminals by the discharge current in the sampling period succeeding the precharge period; and
a differential amplifier circuit being activated after said sampling period for amplifying the drain terminals of the input integrating circuit,
wherein the input integrating circuit performs precharge operation when a predetermined time elapses after the differential amplifier circuit is activated.

2. The receiver circuit according to claim 1,
wherein the input integrating circuit comprises a pair of positive feedback transistors, provided in parallel with the precharge circuit, which charges one drain terminal of the pair of drain terminals, corresponding to a level of the other drain terminal.

3. The receiver circuit according to claim 1,
wherein, in the input integrating circuit, capacitors for dispersion adjustment are respectively connected to the pair of drain terminals via transistors.

4. The receiver circuit according to claim 1,
wherein the pair of input transistors are constituted of first conductivity type transistors, and the input integrating circuit comprises a pair of second conductivity type positive-feedback transistors, provided in parallel with the precharge circuit, which charge one drain terminal of the pair of drain terminals according to a level of the other drain terminal, and capacitors for dispersion adjustment respectively connected to the pair of drain terminals via CMOS transfer gates.

5. The receiver circuit according to claim 1,
wherein the differential amplifier circuit comprises a front-stage differential amplifier circuit amplifying the drain terminal pair of the input integrating circuit, and a latter-stage differential amplifier circuit amplifying output pair of said front-stage differential amplifier circuit.

6. The receiver circuit according to claim 1,
wherein the differential amplifier circuit comprises a second input transistor pair which input the drain terminal pair of the input integrating circuit and drive output terminal pair, a second precharge circuit precharging the output terminal pair during the sampling period of the input integrating circuit, and a latch circuit, provided in parallel with the second precharge circuit, which latches a level difference of the output terminal pair, and
said differential amplifier circuit is activated after the completion of the sampling period to differential-amplify the level difference of the drain terminal pair, and before the start of the sampling period, the output terminal pair is precharged by the second precharge circuit.

7. The receiver circuit according to claim 1, further comprising:
an output latch circuit latching a level of the output terminal pair of the differential amplifier circuit.

8. A receiver circuit unit having the receiver circuits according to claim 1, further comprising:
output latch circuits each of which latches level of the output terminal pair of the differential amplifier circuit; wherein
a plurality of pairs of said receiver circuits are connected in parallel, and
each input integrating circuit of the plurality of pairs of the receiver circuits successively samples the input signals, and each output latch circuit latches the sampled reception data of.

9. A receiver circuit which samples a pair of differential input signals, detects a level of said pair of input signals, and latches the detected level, said receiver circuit comprising:
an input integrating circuit having a pair of input transistors receiving the pair of input signals in respective input transistor gates thereof, wherein, in a precharge period, drain terminal pair of said input transistor pair are precharged to a predetermined level, and, in a sampling period after the precharge period, a discharge current is supplied to the input transistor pair, so that the precharged drain terminal pair are discharged corresponding to level difference of the input signal pair; and
a differential amplifier circuit amplifying the drain terminals of the input integrating circuit,
wherein the differential amplifier circuit is activated after sampling operation by the input integrating circuit, and when said differential amplifier circuit is activated, the discharge current to the input transistor pair of the input integrating circuit is cut off, and the input integrating circuit performs precharge operation when a determined time elapses after the differential amplifier circuit is activated.

10. The receiver circuit according to claim 9,
wherein the input integrating circuit further comprises a switch transistor controlled by a sampling clock, and in response to said sampling clock, said switch transistor supplies the discharge current to the input transistor pair.

11. A receiver circuit unit having the receiver circuits according to claim 9, further comprising:
output latch circuits each of which latches level of the output terminal pair of the differential amplifier circuit; wherein
a plurality of pairs of said receiver circuits are connected in parallel, and
each input integrating circuit of the plurality of pairs of the receiver circuits successively samples the input signals, and each output latch circuit latches the sampled reception data of.

12. A receiver circuit which samples a pair of differential input signals, detects level of said pair of input signals, and latches the detected level, said receiver circuit comprising:
an input integrating circuit including:
a pair of input transistors receiving the pair of input signals at respective gates thereof,
a switch transistor becoming conducting in response to a sampling clock in a sampling period so as to supply a discharge current to a common source terminal of said pair of input transistors, and
a precharge circuit precharging drain terminals of said pair of input transistors in a precharge period,
wherein said input integrating circuit discharges capacitors of the drain terminals by the discharge current in the sampling period succeeding the precharge period; and
a differential amplifier circuit amplifying the drain terminals of the input integrating circuit, wherein, in the input integrating circuit, capacitors for dispersion adjustment are respectively connected to the pair of drain terminals via transistors.

13. A receiver circuit which samples a pair of differential input signals, detects level of said pair of input signals, and latches the detected level, said receiver circuit comprising:
- an input integrating circuit including:
  - a pair of input transistors receiving the pair of input signals at respective gates thereof,
  - a switch transistor becoming conducting in response to a sampling clock in a sampling period so as to supply a discharge current to a common source terminal of said pair of input transistors, and
  - a precharge circuit precharging drain terminals of said pair of input transistors in a precharge period,
  - wherein said input integrating circuit discharges capacitors of the drain terminals by the discharge current in the sampling period succeeding the precharge period; and
- a differential amplifier circuit amplifying the drain terminals of the input integrating circuit,
- wherein the pair of input transistors are constituted of first conductivity type transistors, and the input integrating circuit comprises a pair of second conductivity type positive-feedback transistors, provided in parallel with the precharge circuit, which charge one drain terminal of the pair of drain terminals according to a level of the other drain terminal, and capacitors for dispersion adjustment respectively connected to the pair of drain terminals via CMOS transfer gates.

14. A receiver circuit which samples a pair of differential input signals, detects level of said pair of input signals, and latches the detected level, said receiver circuit comprising:
- an input integrating circuit including:
  - a pair of input transistors receiving the pair of input signals at respective gates thereof,
  - a switch transistor becoming conducting in response to a sampling clock in a sampling period so as to supply a discharge current to a common source terminal of said pair of input transistors, and
  - a precharge circuit precharging drain terminals of said pair of input transistors in a precharge period,
  - wherein said input integrating circuit discharges capacitors of the drain terminals by the discharge current in the sampling period succeeding the precharge period; and
- a differential amplifier circuit amplifying the drain terminals of the input integrating circuit,
- wherein the differential amplifier circuit comprises a front-stage differential amplifier circuit amplifying the drain terminal pair of the input integrating circuit, and a latter-stage differential amplifier circuit amplifying output pair of said front-stage differential amplifier circuit.

* * * * *